US007627840B2

(12) United States Patent
Kleinosowski et al.

(10) Patent No.: US 7,627,840 B2
(45) Date of Patent: Dec. 1, 2009

(54) METHOD FOR SOFT ERROR MODELING WITH DOUBLE CURRENT PULSE

(75) Inventors: A J Kleinosowski, Austin, TX (US); Philip J. Oldiges, Lagrangeville, NY (US); Paul M. Solomon, Yorktown Heights, NY (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 11/457,174

(22) Filed: Jul. 13, 2006

(65) Prior Publication Data
US 2008/0016477 A1 Jan. 17, 2008

(51) Int. Cl.
*G06F 17/50* (2006.01)
*H01L 29/94* (2006.01)

(52) U.S. Cl. .................. 716/4; 716/5; 257/297
(58) Field of Classification Search .............. 716/4, 716/5; 257/297
See application file for complete search history.

(56) References Cited

U.S. PATENT DOCUMENTS 6,330,182 B1 12/2001 Zhang
6,348,356 B1 2/2002 Shabde et al.
6,928,626 B1 8/2005 McGaughy et al.
7,322,015 B2 * 1/2008 Liu et al. ................. 716/4
2008/0077376 A1 * 3/2008 Belhaddad et al. ......... 703/13

OTHER PUBLICATIONS

U.S. Appl. No. 11/355,342, Acar, et al.

* cited by examiner

*Primary Examiner*—Vuthe Siek
*Assistant Examiner*—Patrick Sandoval
(74) *Attorney, Agent, or Firm*—Libby Z. Handelsman; Jack V. Musgrove (57) ABSTRACT

A method of modeling soft errors in a logic circuit uses two separate current sources inserted at the source and drain of a device to simulate a single event upset (SEU) caused by, e.g., an alpha-particle strike. In an nfet implementation the current flows from the source or drain toward the body of the device. Current waveforms having known amplitudes are injected at the current sources while simulating operation of the logic circuit and the state of the logic circuit is determined from the simulated operation. The amplitudes of the current waveforms can be independently adjusted. The simulator monitors the state of device and makes a log entry when a transition occurs. The process may be repeated for other devices in the logic circuit to provide an overall characterization of the susceptibility of the circuit to soft errors.

20 Claims, 6 Drawing Sheets

METHOD FOR SOFT ERROR MODELING WITH DOUBLE CURRENT PULSE

STATEMENT REGARDING FEDERALLY SPONSORED RESEARCH OR DEVELOPMENT

This invention was made with Government support under DARPA, NBCH3039004. THE GOVERNMENT HAS CERTAIN RIGHTS IN THIS INVENTION.

BACKGROUND OF THE INVENTION

1. Field of the Invention

The present invention generally relates to the design and testing of semiconductor chips and integrated circuits, and more particularly to a method of modeling soft errors in a logic circuit that arise from, e.g., an alpha-particle strike.

2. Description of the Related Art

Integrated circuits are used for a wide variety of electronic applications, from simple devices such as wristwatches, to the most complex computer systems. A digital microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells, memory cells and input/output (I/O) cells.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern one or more dies on a silicon wafer using a sequence of photolithographic steps.

Faster performance and predictability of responses are elements of interest in circuit designs. As process technology scales to the deep-submicron regime, it is becoming increasingly important for the performance and reliability of IC chips and systems to understand the effects of soil errors that might arise from stray radiation or electrostatic discharge. For example, a soft error may occur when an alpha particle hits the diffusion regions of a metal-oxide semiconducting (MOS) transistor of a logic circuit and produces a charge that leads to a faulty transition. Alpha emissions are fairly common from the lead in C4 solder that is used for IC interconnects. In a modern MOS transistor, the gate terminal is a layer of polycrystalline silicon separated from a channel of n-type or p-type semiconductor material (silicon or a mixture oaf silicon and germanium) by a thin insulating layer of silicon dioxide or silicon oxynitride. When a voltage is applied between the gate and source terminals, the generated electric field penetrates through the insulating layer and creates an inversion channel which provides a conduit for current flow. An alpha-particle strike at or near the gate terminal can thus affect the applied voltage and change the conducting state of the transistor (a single event upset or SEU).

This effect may be more pronounced with a silicon-on-insulator (SOI) MOS transistor. SOI technology provides a silicon substrate carrying an insulating silicon dioxide layer below a layer of silicon in which the individual field effect transistors are formed by source and drain regions of doped silicon of one polarity separated by a body (channel) of doped silicon of the opposite polarity. A primary benefit of an SOI MOS transistor is the reduced capacitance of the switch, so it operates faster. However, the body region of each individual SOI transistor is electrically insulated from its underlying silicon substrate, so electrical charging of the body is more likely with SOI technology.

A change in the state of a device caused by radiation or electrostatic discharge will only generate an error in the logic circuit if it propagates to a latch or storage element prior to the clock arrival (sampling) time. Nevertheless, many SEUs lead to soft errors in IC chips and computer systems, and the soft error rate (SER) associated with combinational logic is steadily growing. New methodologies are thus needed to ensure circuit reliability by characterizing the events leading to soft errors. One approach to this problem is the use of technology computer-aided design (TCAD) field solvers to simulate the operation of a device as it undergoes an alpha-particle strike through the gate. While field solvers provide useful analytical results, they are very complex to set up and computationally intensive to carry out.

Another approach to modeling the creation of soft errors uses a circuit-level simulation tool such as SPICE which employs numerical integration formulae to form companion models for circuit elements at successive points in time. SPICE uses a netlist file that contains a description of the circuit with appropriate resistance, inductance and capacitance values corresponding to respective nodes as well as nonlinear devices such as transistors or diodes. An analysis is performed at an initial time, the tile variable is then incremented, and an analysis is performed at that next time step, with the process repeating until the final time step is reached. One example of a SPICE-type simulator is described in U.S. Pat. No. 6,928,626.

Figure 1A:
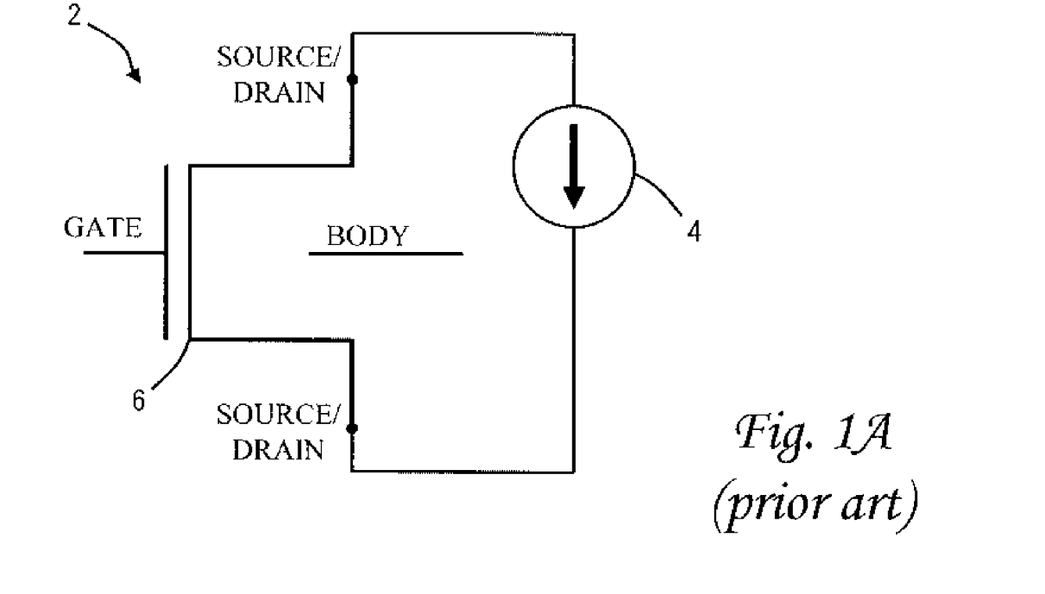
FIGS. 1A and 1B are schematic diagrams illustrating prior art approaches for modeling a single event upset (e.g., an alpha-particle strike) of a transistor.
Figure 1B:
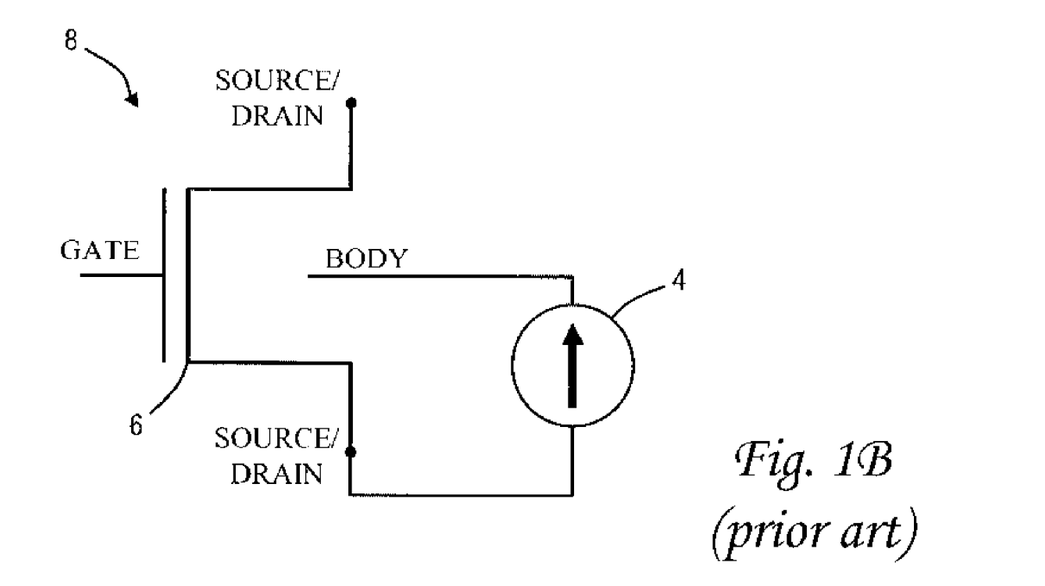

The alpha-particle strike can be modeled as a current source, as illustrated in FIGS. 1A and 1B. FIG. 1A shows one model 2 wherein a current source 4 is inserted between the drain and source terminals of a device 6 with a floating body. FIG. 1B shows another model 8 wherein the current source 4 is inserted between one of the source or drain terminals and the body of device 6. During the simulation, a current pulse of increasing amplitude is repeatedly injected via current source 4 to simulate alpha-particle strikes until the device changes its logical state (e.g., turns on). The current pulse can be integrated over time to compute the critical charge ($Q_{CRIT}$) that was necessary to cause the upset. A similar hardware technique which adjusts the current pulse amplitude and duration to find $Q_{CRIT}$ is disclosed in U.S. Pat. No. 6,330,182.

Circuit simulators such as SPICE are straightforward and fairly quick to run, but they still have significant drawbacks in modeling the circumstances of soft errors. The choice of where and how to inject the current pulse affects simulation accuracy, and if the simulation is not set up properly the results can be inaccurate. It is also impossible to adjust the simulation to take into consideration certain variations in device fabrication such as different source and drain resistances. It would, therefore, be desirable to devise an improved method of simulating soft errors in a logic circuit which could provide a relatively quick analysis with greater accuracy for realistic device parameters. It would be further advantageous if the method could easily be integrated into a design automation tool.

SUMMARY OF THE INVENTION

It is therefore one object of the present invention to provide an improved method of analyzing soft errors that arise in a logic circuit.

It is another object of the present invention to provide such a method having improved accuracy in simulating a device upset.

It is yet another object of the present invention to provide a method of modeling soft errors in a logic circuit which can take into account asymmetric resistances between the source and drain of a device.

The foregoing objects are achieved in a method of modeling a soft error in a logic circuit by providing a circuit description for the logic circuit wherein the circuit description includes at least one device having a source terminal, a drain terminal, a gate terminal and a body, inserting in the circuit description a first current source at the source terminal and a second current source at the drain terminal wherein the first and second current sources direct current in opposing directions with respect to the body, simulating operation of the logic circuit while injecting current waveforms having known amplitudes at the first and second current sources, and determining a state of the logic circuit from the simulated operation. The current waveforms preferably have a double-exponential shape, and can be independently adjusted. For simulation of an n-type field-effect transistor, the first current source directs current from the source terminal to the body and the second current source directs current from the drain terminal to the body. For simulation of a type field-effect transistor, the first current source directs current from the body to the source terminal and the second current source directs current from the body to the drain terminal. The simulation may be repeated for other devices in the logic circuit to characterize the overall susceptibility of the circuit to soft errors. The simulator can monitor the device under test to determine when the device transitions in response to the injected current waveforms, and make a log entry of the amplitudes of the current waveforms.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention provides a novel method for modeling soft errors in logic circuits, and is generally applicable to any type of IC design including general-purpose microprocessors, memory units or special-purpose circuitry, although it is particularly suited for analyzing single event upsets in silicon-on-insulator (SOI) devices. The method may be implemented as part of a physical synthesis process which optimizes placement, timing, power consumption, crosstalk effects or other design parameters. As explained more fully below, an exemplary embodiment of the present invention uses a two current pulse mechanism for exemplifying a flood of carriers in the body and a source/drain of the device.

Figure 2:
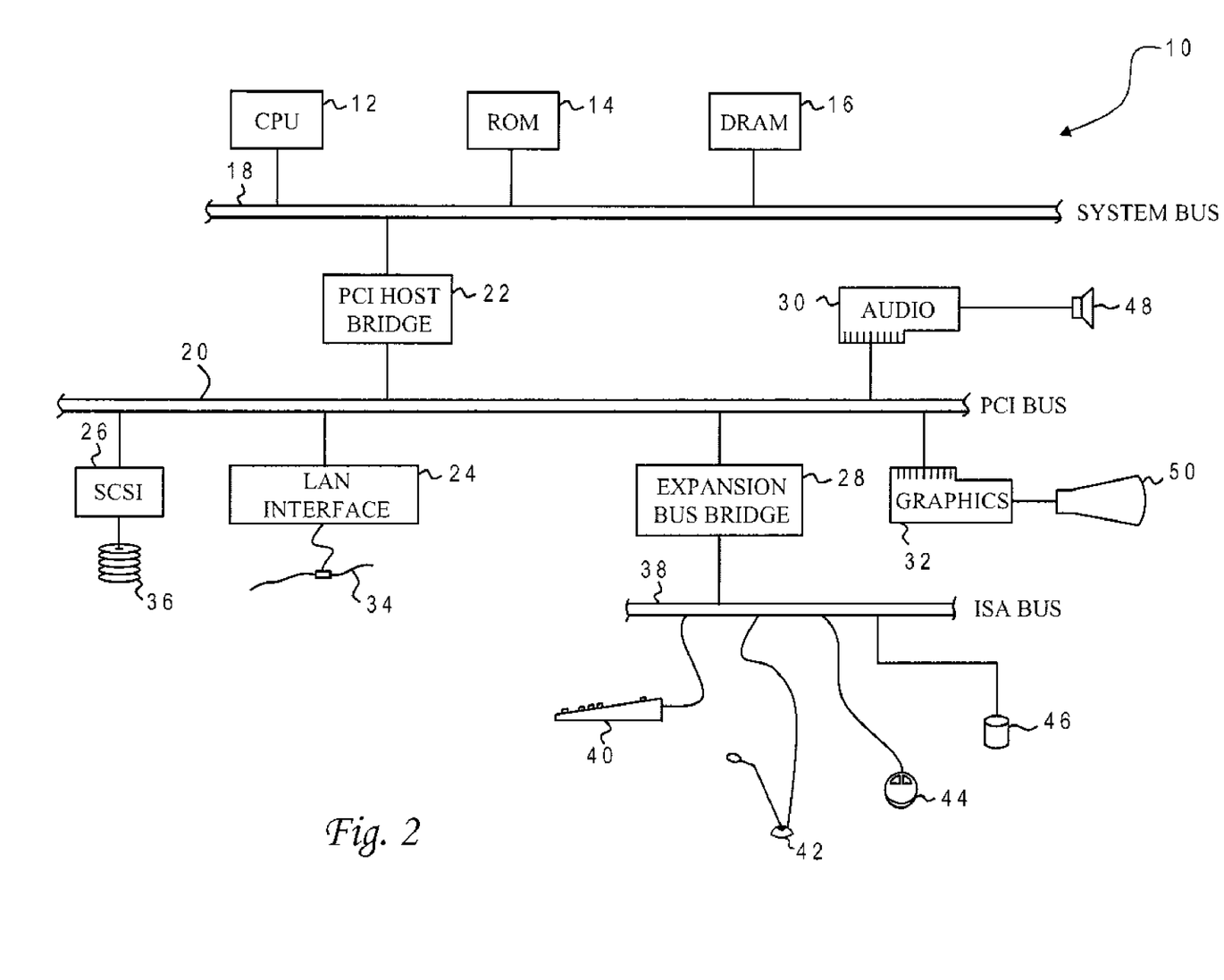
FIG. 2 is a block diagram of a computer system programmed to carry out soft error modeling in accordance with one embodiment of the present invention.

With reference now to the figures, and in particular with reference to FIG. 2, there is depicted one embodiment 10 of a computer system programmed to carry out soft error modeling in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the buffer insertion as taught herein.

While the illustrative implementation provides the program instructions embodying the present invention on disk drive 36, those skilled in the art will appreciate that the invention can be embodied in a program product utilizing other computer-readable media, including transmission media. The program instructions may be written in the C or C++ programming language for an AIX environment. Computer system 10 carries out program instructions for soft error modeling of logic circuits adapted for use in an integrated circuit. Accordingly, a program embodying the invention may include conventional aspects of various IC design tools, and these details will become apparent to those skilled in the art upon reference to this disclosure.

Figure 3A:
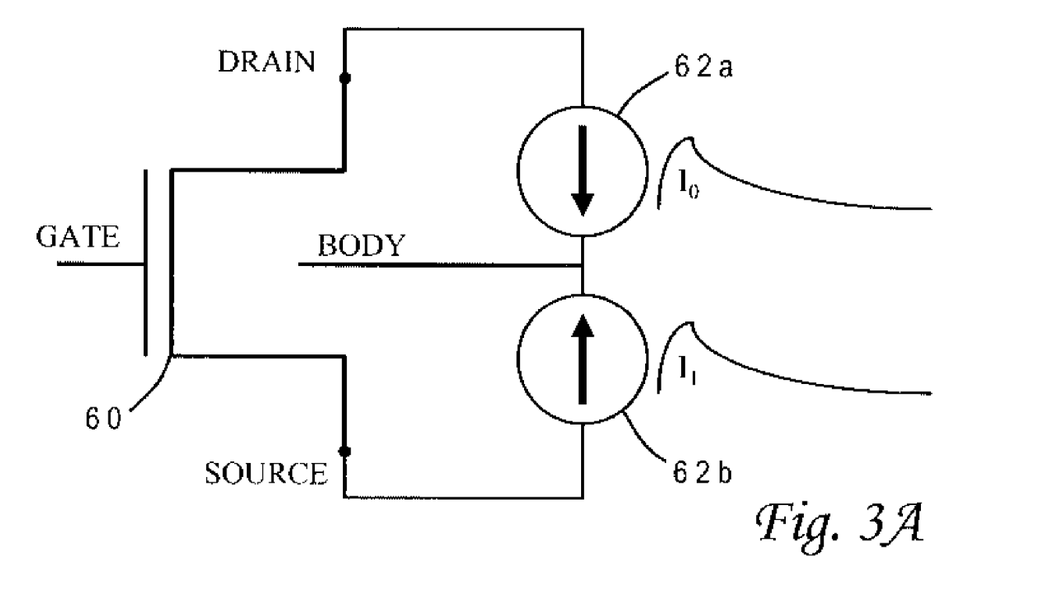
FIGS. 3A and 3B are schematic diagrams illustrating double current pulse modeling of soft errors in accordance with two exemplary implementations of the present invention.
Figure 3B:
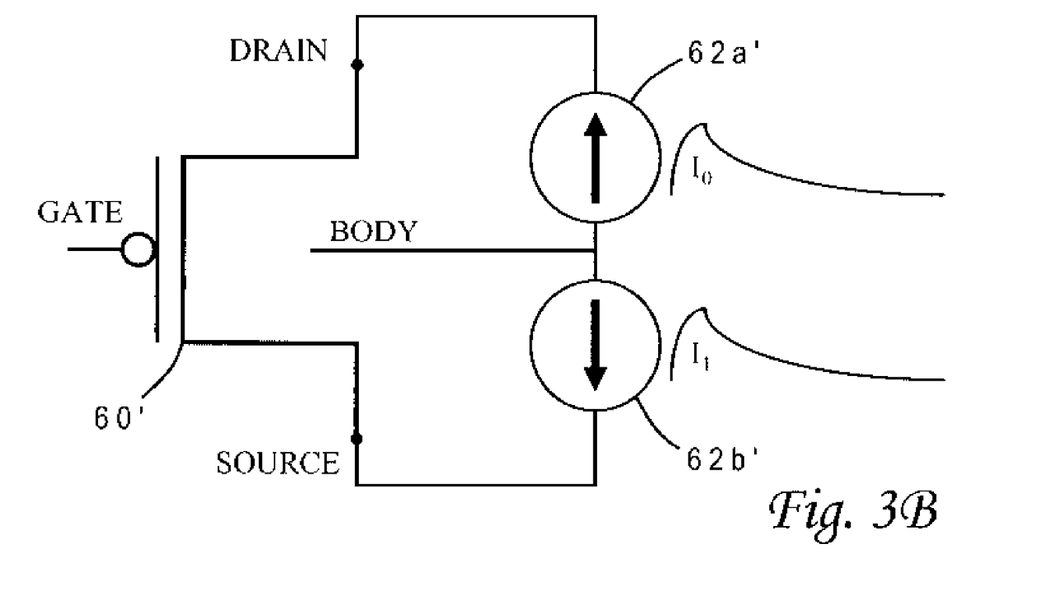

The present invention provides an improved method of modeling soft errors in a logic circuit by using two separate current sources to simulate a single event upset (SEU) of a device caused by, e.g., an alpha-particle strike. The logic circuit may be provided in the form of a netlist or other circuit description, and the current sources are inserted into the circuit description. FIGS. 3A and 3B schematically illustrate how the current sources are utilized in accordance with two exemplary implementations of the present invention. In FIG. 3A the device 60 is an n-type field-effect transistor (nfet), and a first current source 62a is inserted at the drain terminal while a second current source 62b is inserted at the source terminal. Current sources 62a, 62b direct current in opposing directions with respect to the device body; in the nfet implementation of FIG. 3A, the current flows toward the body. If the physical embodiment of the device does )lot allow a connection to the body, the simulation represents the device with an ideal body contact (zero resistance) connected to the current sources.

Current waveforms $I_0$ and $I_1$ having known amplitudes are injected at current sources 62a, 62b while simulating operation of the logic circuit with a SPICE-type simulator, and the state of the logic circuit is determined from the simulated operation. This procedure is repeated for increasing amplitudes of the current waveforms. When current waveforms with sufficiently high amplitudes are injected, device 60 will transition to a different state. The state of the logic circuit may change if the SEU propagates through the logic circuit (a soft error). The state of the device under test changes based on its particular voltage response characteristics and the computed voltages at the source, gate and drain. The simulator advantageously monitors the state of device 60 and, when it changes from nonconducting to conducting, a log entry is made for the amplitudes of the most recent current pulses $I_0$, $I_1$. The critical charge ($Q_{CRIT}$) that caused the upset can be computed by integrating the current waveforms over time. The critical charge can be normalized to a base case for comparative analysis.

Current pulses $I_0$, $I_1$ are injected simultaneously into current sources 62a, 62b. However, the current pulses can have different amplitudes to take into consideration different drain and source resistances. If the relative drain and source resistances are known (from direct hardware measurement or from a simulation such as by a field solver), the two current pulse amplitudes can be set with proportional amplitudes. For example, if the drain is known to have half as much resistance as the source, the amplitude of the current source connected to the drain can be set to twice the amplitude of the current source connected to the source. Conversely, if the critical charge $Q_{CRIT}$ of the logic circuit is known from direct hardware measurement or simulation, a series of simulations can be conducted with different current pulse amplitude ratios to determine the source and drain resistances. This feature of the invention provides greater accuracy in the body-to-source and drain-to-source voltage responses.

The current waveforms $I_0$, $I_1$=I(t) preferably have a double-exponential shape which may be expressed as $$I(t) = \frac{Q}{\tau_f - \tau_r}\left(e^{\frac{t}{\tau_f}} - e^{\frac{-t}{\tau_r}}\right)$$

where t is time, Q is a representative charge, $\tau_f$ is a fall time constant, and $\tau_r$ is a rise time constant. This waveform is preferred since it can achieve a nearly instantaneous rise time by selecting a fast rise time constant $\tau_r$. In an illustrative implementation for a 65 nm SOI cross-coupled logic circuit, Q is in the approximate range of 0.25-1 femtocoulomb, $\tau_f$ is around 1 picosecond, and $\tau_r$ is around 50 femtoseconds.

In FIG. 3B the device 60' is an p-type field-effect transistor (pfet), and a first current source 62a' is inserted at the drain terminal while a second current source 62b' is inserted at the source terminal. Current sources 62a', 62b' direct current away from the body. The amplitudes of the current pulses may again be independently adjusted, and the current waveform still has the double-exponential shape. In setting up the pfet implementation, the simulator begins with pfet 60' active (in a nonconducting state), so that the SEU transitions the device to a conducting state.

After one device has been analyzed regarding its susceptibility to an SEU, the modeling process can be repeated for other devices in the logic circuit. In this manner the designer can identify which devices present the greatest potential for causing soft errors in the circuit.

Figure 4:
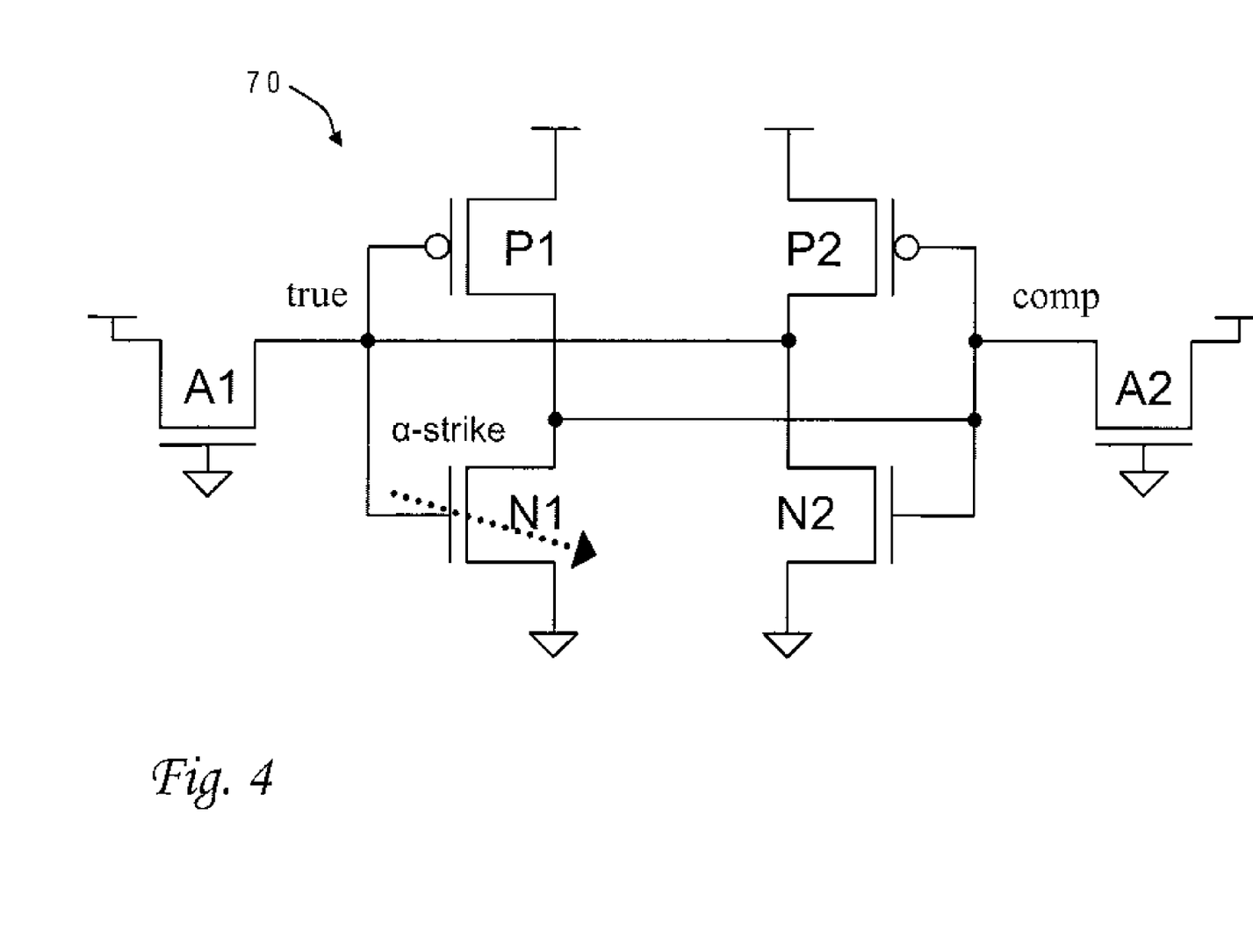
FIG. 4 is a schematic diagram of one embodiment of a memory cell (SRAM) whose operation is simulated in accordance with the present invention during a single event upset.

The present invention is particularly useful in analyzing how soft errors occur in storage elements such as memory cells or latches. FIG. 4 depicts one embodiment of a static, random-access memory (SRAM) cell 70 which may be modeled in accordance with the present invention as an alpha particle strikes nfet N1. The simulator sets up SRAM 70 to store a logic value 0, which means the true node (the gate of nfet N1) is at the ground voltage rail and the complementary node (the drain of N1) is at the power supply ($V_{dd}$) voltage rail. The charge generated from the alpha particle strike causes the voltage on the body of nfet N1 to rise, causing nfet N1 to partially turn on. This transition will cause current to flow from the drain of nfet N1 to the source of nfet N1, reducing the voltage on the comp node. If the voltage on the comp node reaches the threshold voltage of pfet P2, then pfet P2 will turn on and begin conducting current from the positive voltage rail to the true node thereby raising the voltage of the true node, which will turn on nfet N1 even more. In this manner, the logical state of SRAM 70 can change to store a logic value 1, which means the true node (the gate of nfet N1) is at the $V_{dd}$ voltage rail.

Figure 5:
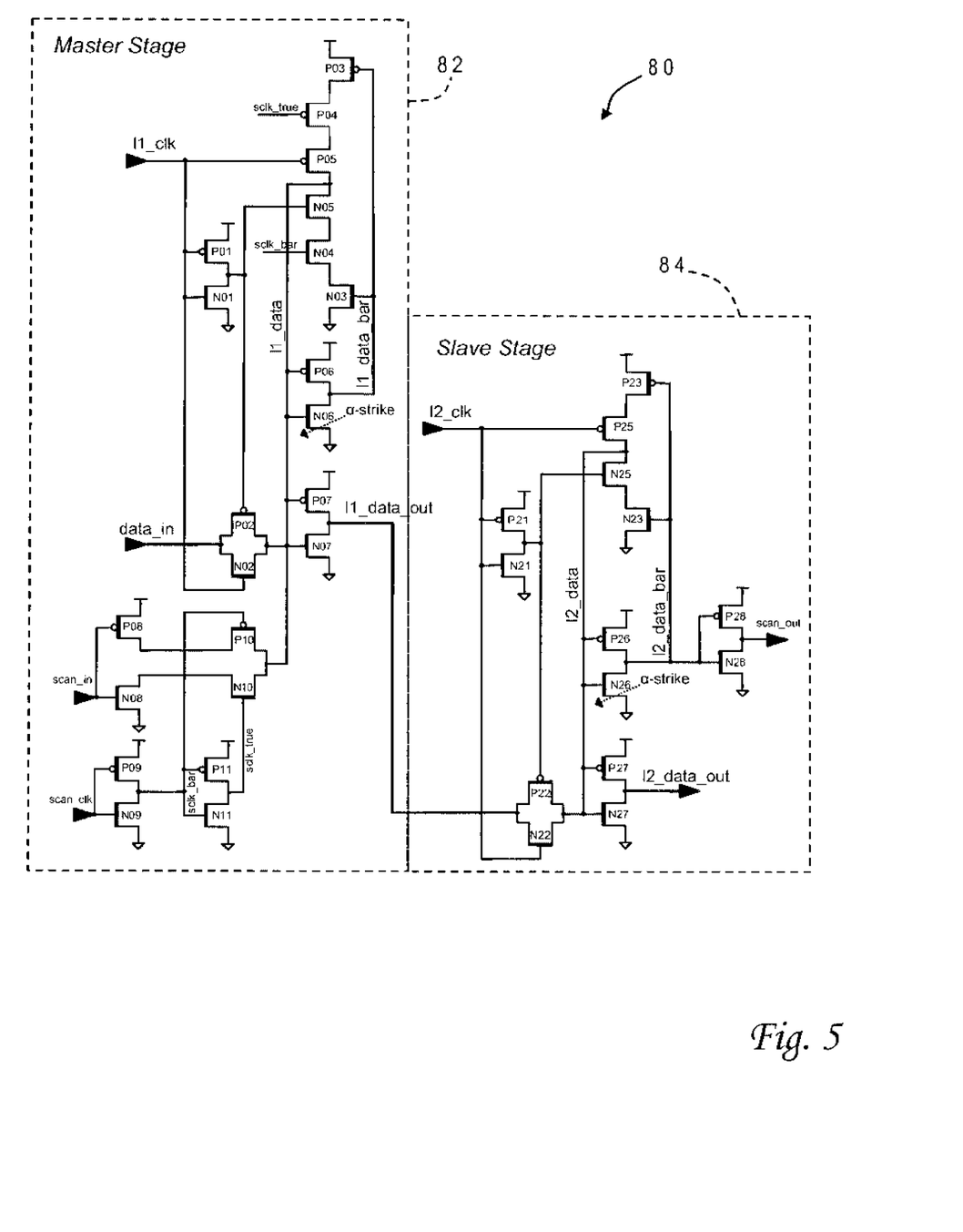
FIG. 5 is a schematic diagram of one embodiment of a latch circuit whose operation is simulated in accordance with the present invention during a single event upset.

FIG. 5 depicts one embodiment of a master/slave latch circuit 80 which may be modeled in accordance with the present invention. Latch circuit 80 includes a master stage 82 whose output feeds the input of a slave stage 84. When latch circuit 80 is holding a logical state the 11_elk and 12_clk signals are kept low, causing the clocked devices in the feedback path (devices P05 and N05 in master stage 82 and devices P25 and N25 in slave stage 84) to be turned on. This state sets up the latch in a similar situation as the SRAM cell described above. For example, if the master stage stores a logical 0, and device N06 experiences an alpha particle strike, the voltage on the 11_data_bar node will drop, which may turn on device P03. Current flowing through device P03 will raise the voltage on the 11_data node, which will change the logical state of latch circuit 80. A similar situation occurs in slave stage 84 of the latch if the slave stage stores a logical 0 and device N26 is struck by an alpha particle.

Figure 6:
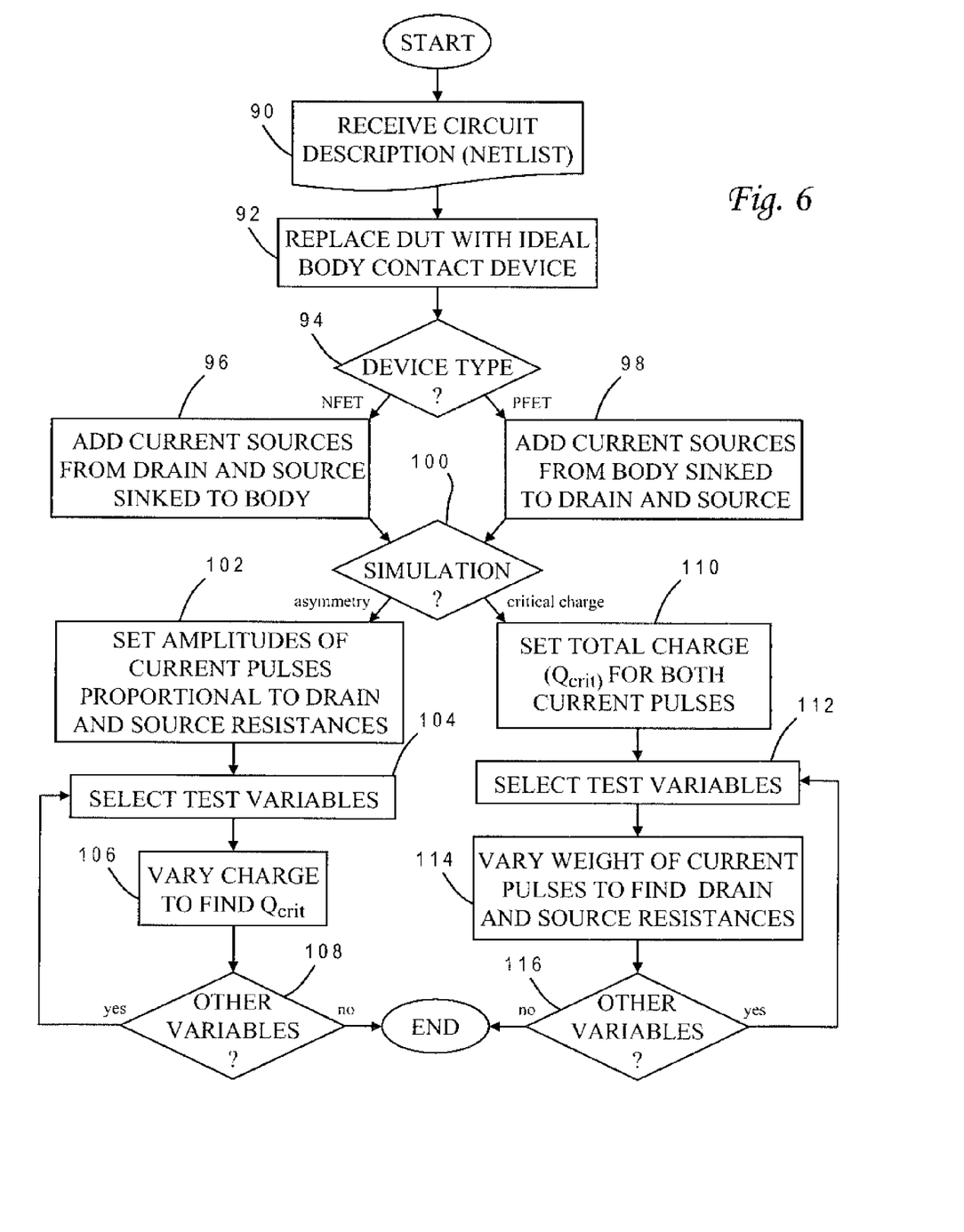
FIG. 6 is a chart illustrating the logical flow for analyzing soft errors arising in a logic circuit in accordance with one embodiment of the present invention.

The present invention may be further understood with reference to the flow chart of FIG. 6. The modeling process begins with a netlist or other logical description for the circuit which is provided using a conventional electronic design automation (EDA) tool such as Verilog or SPICE (90). If the particular device under test (DUT) in the circuit does not have a physical body contact, the device is replaced with a device having an ideal body contact (92). The manner in which the current sources are inserted depends on the device type (94). For an nfet transistor current sources are directed from the drain and source sinked to the body (96), and for a pfet transistor current sources are directed from the body sinked to the drain and source (98). The designer then has a choice as to the type of simulation to run (100). In this exemplary implementation, the choices include a drain/source resistance asymmetry simulation, and a critical charge simulation.

For the asymmetry simulation, the proportions of the two current pulses are set based on differences between the drain and source junction design, e.g., the ratio of the drain and source resistances (102). This ratio is a known value that may be determined using a field solver or direct hardware measurement. Appropriate test variables are selected such as operating voltages, temperatures, etc. (104). Simulations are then repeated while varying the total charge applied by the two current sources but keeping the current ratio the same, to find the critical charge necessary to create a soft error (106). This process may be repeated for other test variables (108).

For the critical charge simulation, a known value for $Q_{CRIT}$ is set as the total charge for both current pulses, with an initial weighting of 50%/50% between the two current sources (110). The critical charge may be determined using a field solver or direct hardware measurement. Appropriate test variables are selected such as operating voltages, temperatures, etc. (112). Simulations are then repeated while varying the weighting between the two current sources but keeping the total charge constant, to find the drain and source resistances that result in a soft error (114). This process may again be repeated for other test variables (116).

Use of the two current pulse mechanism to represent the source of an upset provides a more accurate representation of charge transport in device. The present invention further advantageously allows the designer to adjust for asymmetric resistance between the source and drain of the device. The invention has the further benefit of easily being integrated into a design automation tool such as a SPICE-type simulator.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention is not limited in application to storage elements such as SRAM cells or latches, but can be applied to any combinational logic. It is therefore contemplated that such modifications can be made without departing from the spirit or scope of the present invention as defined in the appended claims.

What is claimed is:

1. A method of modeling a soft error in a logic circuit, comprising:
providing a circuit description for the logic circuit wherein the circuit description includes at least one device having a source terminal, a drain terminal, a gate terminal and a body;
inserting in the circuit description a first current source at the source terminal and a second current source at the drain terminal wherein the first and second current sources direct current in opposing directions with respect to the body;
simulating operation of the logic circuit while injecting a first current waveform at the first current source and injecting a second current waveform at the second current source, wherein the first and second current waveforms have different amplitudes based on a ratio of drain and source resistances of the device; and
determining a state of the logic circuit from the simulated operation.

2. The method of claim 1 wherein the current waveforms have a double-exponential shape expressed as $$I(t) = \frac{Q}{\tau_f - \tau_r}\left(e^{\frac{-t}{\tau_f}} - e^{\frac{-t}{\tau_r}}\right)$$

where t is time, Q is a representative charge, $\tau_f$ is a fall time constant, and $\tau_r$ is a rise time constant.

3. The method of claim 1 further comprising repeating the simulated operation of the logic circuit while injecting current waveforms having adjusted amplitudes at the first and second current sources.

4. The method of claim 1 wherein:
the device is an n-type field-effect transistor;
the first current source directs current from the source terminal to the body; and
the second current source directs current from the drain terminal to the body.

5. The method of claim 1 wherein:
the device is an p-type field-effect transistor;
the first current source directs current from the body to the source terminal; and
the second current source directs current from the body to the drain terminal.

6. The method of claim 1 wherein the circuit description includes at least one other device having a source terminal, a drain terminal, a gate terminal and a body, and further comprising:
removing the first and second current sources from the circuit description;
inserting in the circuit description a third current source at the source terminal of the other device and a fourth current source at the drain terminal of the other device wherein the third and fourth current sources direct current in opposing directions with respect to the body of the other device;
simulating a second operation of the logic circuit while injecting current waveforms having known amplitudes at the third and fourth current sources; and
determining a state of the logic circuit from the second simulated operation.

7. The method of claim 1 further comprising monitoring a state of the device to determine when the device transitions in response to the injected current waveforms.

8. The method of claim 7 further comprising making a log entry of the amplitudes of the current waveforms when the device transitions.

9. A computer system comprising:
one or more processors which process program instructions;
a memory device connected to said one or more processors; and
program instructions residing in said memory device which when executed by said one or more processors perform the method for modeling a soft error in a logic circuit by providing a circuit description for the logic circuit wherein the circuit description includes at least one device having a source terminal, a drain terminal, a gate terminal and a body, inserting in the circuit description a first current source at the source terminal and a second current source at the drain terminal wherein the first and second current sources direct current in opposing directions with respect to the body, simulating operation of the logic circuit while injecting a first current waveform at the first current source, and injecting a second current waveform at the second current source wherein the first and second current waveforms have different amplitudes based on a ratio of drain and source resistances of the device, and determining a state of the logic circuit from the simulated operation.

10. The computer system of claim 9 wherein the current waveforms have a double-exponential shape as expressed as $$I(t) = \frac{Q}{\tau_f - \tau_r}\left(e^{\frac{t}{\tau_f}} - e^{\frac{-t}{\tau_r}}\right)$$

where t is time, Q is a representative charge, $\tau_f$ is a fall time constant, and $\tau_r$ is a rise time constant.

11. The computer system of claim 9 wherein said program instructions further repeat the simulated operation of the logic circuit while injecting current waveforms having adjusted amplitudes at the first and second current sources.

12. The computer system of claim 9 wherein the circuit description includes at least one other device having a source terminal, a drain terminal, a gate terminal and a body, and said program instructions further remove the first and second current sources from the circuit description, insert in the circuit description a third current source at the source terminal of the other device and a fourth current source at the drain terminal of the other device wherein the third and fourth current sources direct current in opposing directions with respect to the body of the other device, simulate a second operation of the logic circuit while injecting current waveforms having known amplitudes at the third and fourth current sources, and determine a state of the logic circuit from the second simulated operation.

13. The computer system of claim 9 wherein said program instructions further monitor a state of the device to determine when the device transitions in response to the injected current waveforms.

14. The computer system of claim 13 wherein said program instructions further make a log entry of the amplitudes of the current waveforms when the device transitions.

15. A computer program product comprising:
a computer-readable medium; and
program instructions residing in said medium which when executed by a computer perform the method for modeling a soft error in a logic circuit by providing a circuit description for the logic circuit wherein the circuit description includes at least one device having a source terminal, a drain terminal, a gate terminal and a body, inserting in the circuit description a first current source at the source terminal and a second current source at the drain terminal wherein the first and second current sources direct current in opposing directions with respect to the body, simulating operation of the logic circuit while injecting a first current waveform at the first current source and injecting a second current waveform at the second current source, wherein the first and second current waveforms have different amplitudes based on a ratio of drain and source resistances of the device, and determining a state of the logic circuit from the simulated operation.

16. The computer program product of claim 15 wherein the current waveforms have a double-exponential shape expressed as $$I(t) = \frac{Q}{\tau_f - \tau_r}\left(e^{\frac{t}{\tau_f}} - e^{\frac{-t}{\tau_r}}\right)$$

where t is time, Q is a representative charge, $\tau_f$ is a fall time constant, and $\tau_r$ is a rise time constant.

17. The computer program product of claim 15 wherein said program instructions further repeat the simulated operation of the logic circuit while injecting current waveforms having adjusted amplitudes at the first and second current sources.

18. The computer program product of claim 15 wherein the circuit description includes at least one other device having a source terminal, a drain terminal, a gate terminal and a body, and said program instructions further remove the first and second current sources from the circuit description, insert in the circuit description a third current source at the source terminal of the other device and a fourth current source at the drain terminal of the other device wherein the third and fourth current sources direct current in opposing directions with respect to the body of the other device, simulate a second operation of the logic circuit while injecting current waveforms having known amplitudes at the third and fourth current sources, and determine a state of the logic circuit from the second simulated operation.

19. The computer program product of claim 15 wherein said program instructions further monitor a state of the device to determine when the device transitions in response to the injected current waveforms.

20. The computer program product of claim 19 wherein said program instructions further make a log entry of the amplitudes of the current waveforms when the device transitions.

* * * * *